United States Patent
Falk (12)

(10) Patent No.: US 7,595,637 B2
(45) Date of Patent: Sep. 29, 2009

(54) APPARATUS FOR DIGITAL MEASUREMENT OF QUICK BREAK VOLTAGE AND MAGNETIC PULSE DURATION

(75) Inventor: Gregory James Falk, 315 Jennifer La., Roselle, IL (US) 60172

(73) Assignee: Gregory James Falk, Roselle, IL (US)

( * ) Notice: Subject to any disclaimer, the term of this patent is extended or adjusted under 35 U.S.C. 154(b) by 271 days.

(21) Appl. No.: 11/880,689

(22) Filed: Jul. 24, 2007

(65) Prior Publication Data

US 2008/0046206 A1 Feb. 21, 2008

Related U.S. Application Data

(60) Provisional application No. 60/838,615, filed on Aug. 19, 2006.

(51) Int. Cl.
*G01R 33/02* (2006.01)
*G01R 33/022* (2006.01)

(52) U.S. Cl. .................................... 324/260; 324/262
(58) Field of Classification Search ................ 324/200, 324/202, 226, 227, 260, 261, 262
See application file for complete search history.

*Primary Examiner*—Kenneth J Whittington

(57) ABSTRACT

A Apparatus for Digital measurement of Quick break voltage and Magnetic pulse duration with microcontroller performs detection and measurement of both shot time (pulse duration) and quick break voltage, absolute value circuit makes detection polarity insensitive, allowing the magnetic pick up probe to be oriented either way in the customer's magnetizing unit coil, precision analog to digital convertor allows software peak detection of quick break voltage under software control of microcontroller, precision timebase of microcontroller allows accurate shot time (pulse duration) measurement, magnetic pick up probe serves as the input transducer for the for the noise free measurement of both shot time and quick break voltage, and microcontroller provides input blanking to ensure capturing the correct voltage spike for quick break voltage detection.

2 Claims, 4 Drawing Sheets

APPARATUS FOR DIGITAL MEASUREMENT OF QUICK BREAK VOLTAGE AND MAGNETIC PULSE DURATION

CROSS REFERENCE TO RELATED APPLICATIONS

This application is based on provisional application Ser. No. 60/838,615, filed on Aug. 19, 2006.

STATEMENT REGARDING FEDERALLY SPONSORED RESEARCH OR DEVELOPMENT

Not Applicable

DESCRIPTION OF ATTACHED APPENDIX

Not Applicable

BACKGROUND OF THE INVENTION

This invention relates generally to the field of non destructive magnetic particle inspection systems and more specifically to a Apparatus for Digital measurement of Quick break voltage and Magnetic pulse duration.

Quick break is defined by the rate of decay or the fall time of the magnetic pulse in the customer's magentizing power supply coil circuit. The faster the decay of the magnetic field at the end of the pulse, the better the "quick break". It is important to have quick break as it maximizes the sensitivity of flaw detection when using a magnetic inspection (Magnaflux) power supply system, commonly known as non destructive testing system.

This new digital quick break detector uses a microcontroller to sample the input waveform from a magnetic pick up coil, and digitally displays the result as a voltage on a LCD display, which indicates the quality of the quick break in a quantitative way . . . .

Further, at the same time as this device measures the quick break quality, it also measures the time duration of the magnetic pulse that is produced by the customer's magnetic power supply, and displays it on a LCD display.

The method of prior art for measuring quality of quick break uses a inductive pick up coil connected to a neon lamp. This method allows the lamp to flash at the end of the magnetic pulse, due to the peak voltage induced across the inductive pick up coil by the rapidly decaying magnetic field produced by the customer's magnetic power supply. The presence of a flash from the lamp indicates a "pass" condition for quick break quality of the customer's magnetic power supply. The absence of a flash from the lamp indicates a "fail" condition for the quick break quality of the customer's power supply. There is no quantitative measurement of the quick break quality, instead only a qualitative "pass/fail" indication.

The method of prior art for measuring magnetic pulse duration is using a resistive current shunt pick up for triggering timing device and measuring the duration of the current pulse produced by the customer's magnetic power supply.

For quick break quality detection, the prior art in use today is deficient for the following reasons:

1) The flashing lamp only provides a qualitative indication of the quick break quality, using a "pass/fail" indication, which does not allow the user to judge the quality of the quick break, with the precision of a quantitative digital reading, to determine with what safety margin one passes the quick break test.

2) The neon bulb firing voltage can vary significantly from one bulb to the next, causing unreliable pass or fail indications For the magnetic pulse duration (shot time) measurement, the prior art in use today is deficient for the following reasons:

1) The transducer pick up is a resistive current shunt, which induces a voltage across this resistance as a function of the current passed through it, and this voltage is prone to noisy conditions and unreliable triggering as this shunt is not electrically isolated from the customer's magnetic power supply, hence the accuracy of the magnetic pulse duration measurement is not very accurate 2) The use of a resistive shunt for triggering is not actually measuring the magnetic pulse, but rather the current that produces the magnetic pulse, which again causes a error in the time measurement of the pulse duration

BRIEF SUMMARY OF THE INVENTION

The primary object of the invention is to provide quantitative indication of the quick break voltage thru digital display readout.

Another object of the invention is to provide quantitative indication of the magnetic pulse duration (shot time) through digital display readout.

Another object of the invention is that it utilizes microprocessor control to give high accuracy readout.

A further object of the invention is that it utilizes a magnetic pick up probe to eliminate electrical noise pick up, and provide reliable magnetic pulse duration (shot time) measurements.

Other objects and advantages of the present invention will become apparent from the following descriptions, taken in connection with the accompanying drawings, wherein, by way of illustration and example, an embodiment of the present invention is disclosed.

In accordance with a preferred embodiment of the invention, there is disclosed a Apparatus for Digital measurement of Quick break voltage and Magnetic pulse duration comprising: microcontroller which performs detection and measurement of both shot time (pulse duration) and quick break voltage, absolute value circuit makes detection polarity insensitive, allowing the magnetic pick up probe to be oriented either way in the customer's magnetizing unit coil, precision analog to digital convertor allows software peak detection of quick break voltage under software control of microcontroller, precision timebase of microcontroller allows accurate shot time (pulse duration) measurement, magnetic pick up probe serves as the input transducer for the for the noise free measurement of both shot time and quick break voltage, and microcontroller provides 100 millisecond input blanking to ensure capturing the correct voltage spike for quick break voltage detection.

BRIEF DESCRIPTION OF THE DRAWINGS

The drawings constitute a part of this specification and include exemplary embodiments to the invention, which may be embodied in various forms. It is to be understood that in some instances various aspects of the invention may be shown exaggerated or enlarged to facilitate an understanding of the invention.

DETAILED DESCRIPTION OF THE PREFERRED EMBODIMENTS

Detailed descriptions of the preferred embodiment are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

Quick Break Voltage Detection Method

Figure 1:
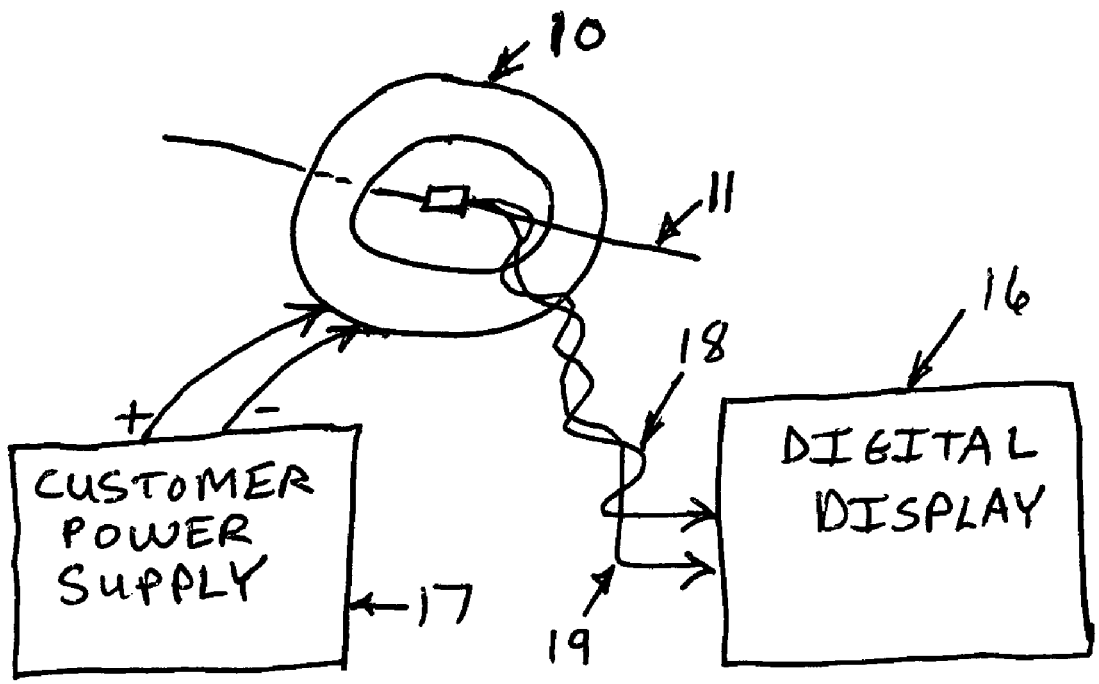
FIG. 1 is a block diagram of the end application.
Figure 2:
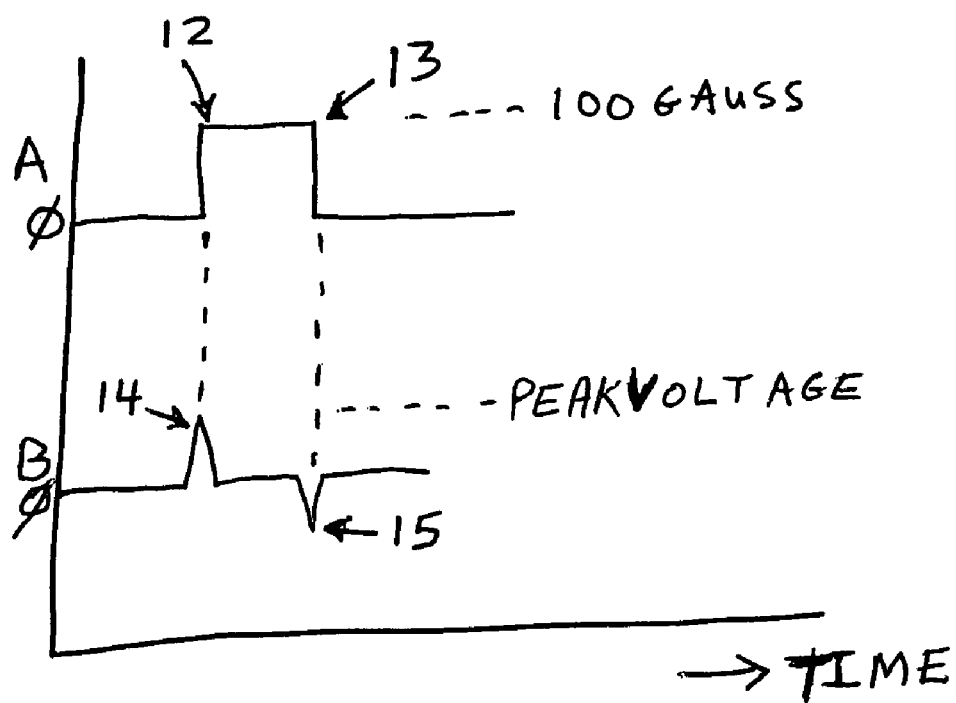
FIG. 2 is a application timing diagram

Turning to FIG. 1, we get an overview of the customer application: The customer magnetic current power supply is comprised of a coil 10 and the power supply itself 17. The magnetic pick up probe 11 of the invention is inserted longitudinally into the center of the customer coil 10. The output leads 18 and 19 of probe 11 are connected to digital display apparatus 16. Turning to FIG. 2, the customer power supply produces a magnetic pulse 12 in customer coil, which in turn induces a first voltage spike 14 in the magnetic pick up probe coincident with the beginning of the magnetic pulse 12, and a second voltage spike 15 is induced in the magnetic pick up probe coincident with the end of the magnetic pulse 13. It should be noted that the first voltage spike 14 is not measured and it is excluded by the action of the software blanking of the apparatus.

The peak amplitude in volts of the second induced voltage spike 15 coincident with the end of magnetic pulse 13 is measured by the apparatus and displayed on a digital LCD display apparatus. This voltage is the quick break voltage. The higher the quick break voltage measured, the better the quick break of the customer's magnetic power supply. The quick break voltage is then recorded by the operator as quantitative proof of the quality of the quick break.

Figure 3:
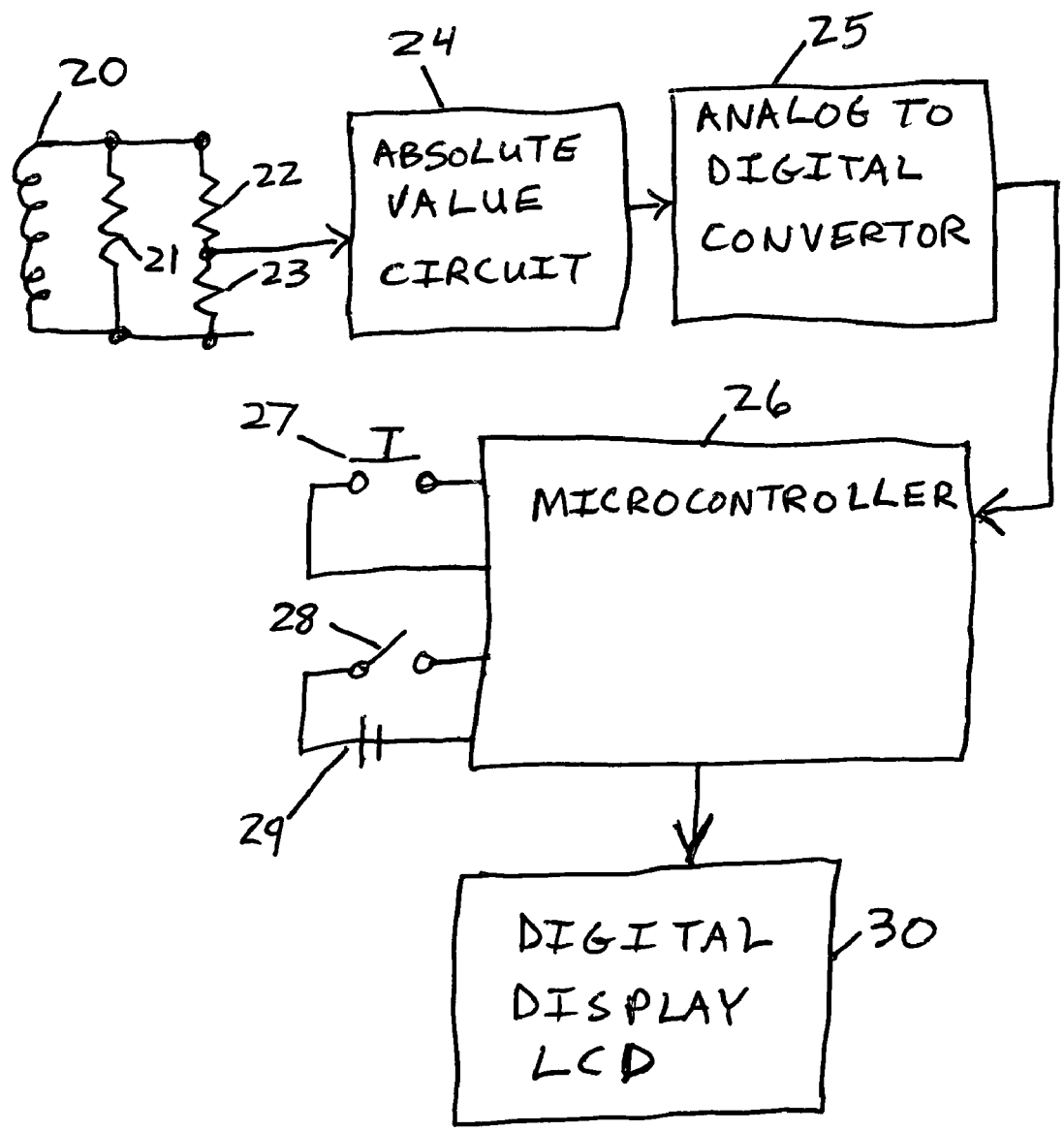
FIG. 3 is a schematic block diagram of the invention utilizing a microcontroller

Turning to FIG. 3, you can see a block diagram of the apparatus claimed in this patent disclosure. The magnetic pick up coil 20 senses the magnetic field pulse of the customer's power supply, making a induced voltage spike across burden resistor 21, this voltage is further attenuated by resistor 22 and resistor 23, and fed into the absolute value circuit 24, which makes the circuit insensitive to which direction the pick up coil 20 is inserted into the customer's coil. The output voltage of the absolute value circuit 24 is fed to the analog to digital voltage convertor 25, whose digital result is sampled by the microcontroller 26 until the peak voltage of the induced voltage spike is recorded, and this resulting voltage is displayed on the LCD display 30 by the microcontroller 26. It should be noted that there are two voltage spikes induced by the single magnetic pulse coming from the customer's power supply coil: the first voltage spike is ignored thru software blanking of microcontroller 26, and only the peak voltage of the second voltage spike is recorded and displayed by the microcontroller 26. The apparatus is reset for the next reading by pushing "reset" button 27. The power from 9 volt battery 29 is switched on and off to the apparatus by switch 28.

Figure 4:
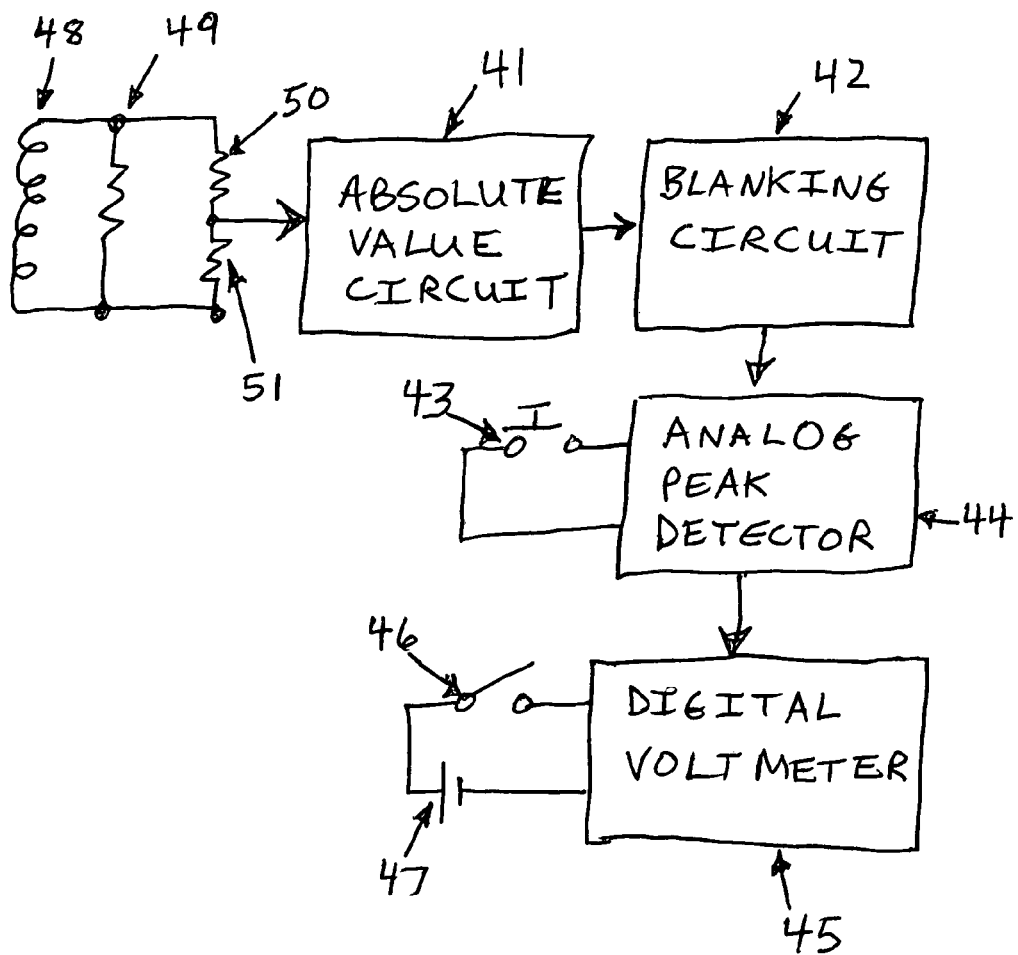
FIG. 4 is a schematic block diagram of the invention utilizing analog peak detector and digital voltmeter

Turning to FIG. 4, you can see an alternate implementation for measuring quick break voltage using a digital voltmeter 45, an additional analog blanking circuit 42 and analog peak detector 44, instead of the microcontroller which performed those functions in the previous example of FIG. 3. Pick up coil 48, burden resistor 49, resistors 50 and 51, absolute value circuit 41, pushbutton 43, switch 46, battery 47 all perform the same functions as in the previous example of FIG. 3.

Figure 5:
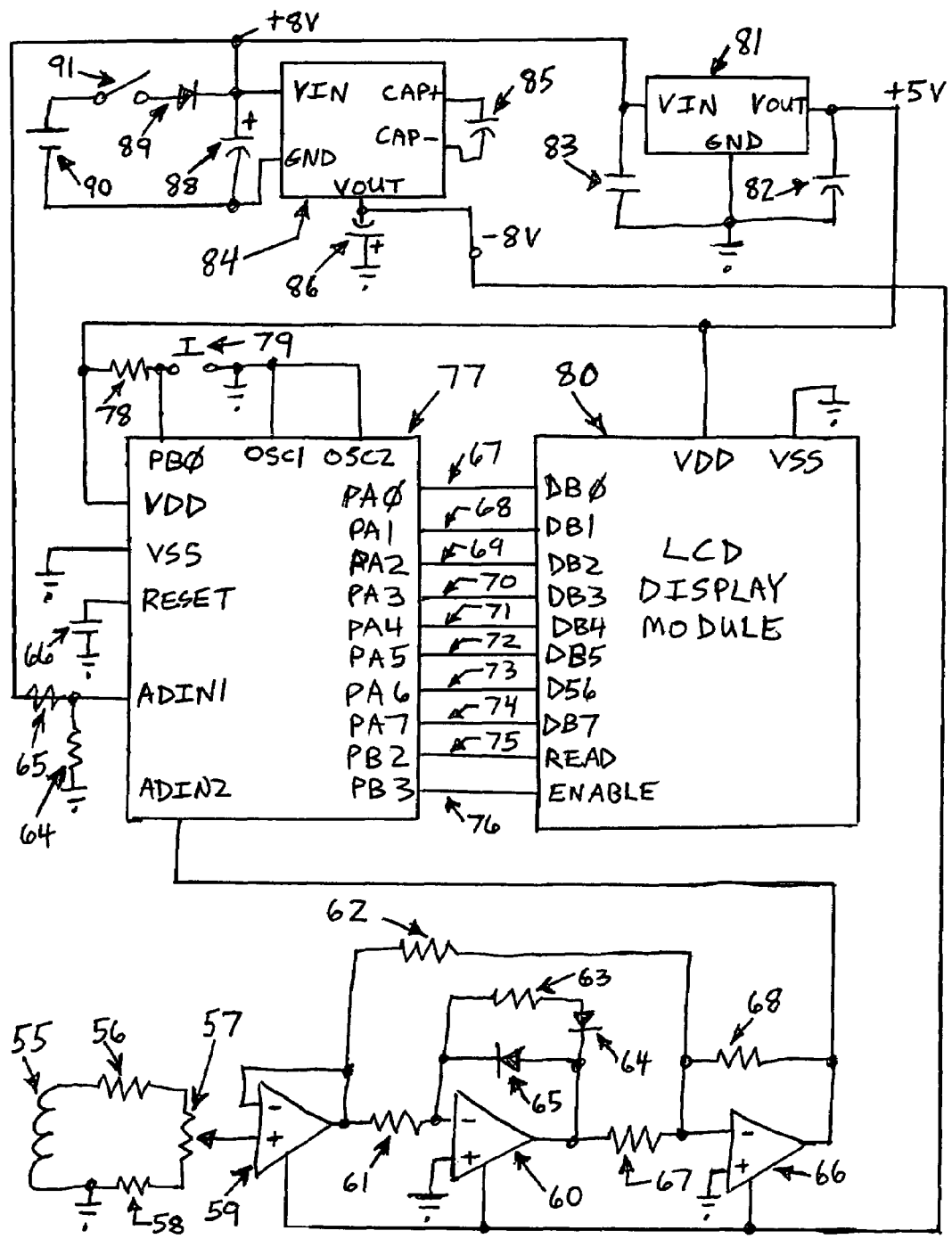
FIG. 5 is an electrical schematic of the invention.

Turning to FIG. 5, I show the detailed electrical schematic of the apparatus claimed in this patent disclosure. Battery 90 provides positive polarity 9 volt power thru switch 91, which is fed thru polarity protection diode 89, and filtered by capacitor 88, which in turn is inverted to a negative 8 volts by regulator IC 84, in conjuction with capacitors 85 and 86. Regulated positive 5 volt power is provided thru regulator 81, in conjuction with stability capacitors 82 and 83. The voltage spikes induced by magnetic pick up coil 55 during the quick break test are fed into attenuation network resistors 56,57 and 58, the output of which is buffered by amplifier 59, and fed to absolute value circuit comprised of amplifiers 60 and 66, and associated gain setting resistors 60,61,63,67,68, plus diodes 64 and 65. The voltage output of amplifier 66 is then fed to the analog to digital converter inside the microcontroller 77, where via software the peak quick break voltage is measured and displayed on the LCD display 80. The LCD display 80 is controlled by microcontroller 77 digital output lines 67,68, 69,70,71,72,73,74,75 and 76. Reset pushbutton 79 and pull up resistor 78 allows you to reset the apparatus to be ready to display another quick break voltage measurement. Once the power to the apparatus is switched on by switch 91, the microcontroller 77 is sampling the output of magnetic pick up coil 55 continuously, waiting for the voltage spike to be detected. Low battery detection is provided by microcontroller 77 analog to digital converter input provides power up reset pulse to microcontroller 77.

Shot Time Measurement Method

The shot time (magnetic pulse duration) measurement utilizes all of the same circuitry of FIG. 5 that was used for measuring quick break voltage in the above description, the difference being that the software in the microcontroller 77 is programmed to sample the time duration of the magnetic pulse (shot time) provided by the customer magnetizing power supply. There are 2 methods of measuring the shot time:

A) Turning to FIG. 2, this first method utilizes software to measure the time difference between the peak of voltage spike 14 (coincident with the beginning of magnetic pulse 12) and the peak of voltage spike 15 (coincident with the end of the magnetic pulse 13). This time difference is the magnetic pulse duration or "shot time", the result of which is displayed digitally on the apparatus.

b) Turning to FIG. 2, this second method utilizes software to measure any voltage activity induced by the magnetic pulse during its entire duration from the rising edge 12 to the falling edge 13, in the magnetic pick up coil of the apparatus. The length of time that voltage activity is sensed corresponds to the magnetic pulse duration to be digitally displayed on the apparatus.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. An apparatus for quantitative measurement of quick break voltage of a magnetizing unit coil outputting a pulse magnetic field, comprising:

A magnetic pick-up probe to serve as transducer for measurement of the quick break voltage oriented in the magnetizing unit coil;

An absolute value circuit receiving a pick-up signal from the pick-up probe and creating a magnitude signal representing the magnitude of the pick-up signal;

An analog to-digital converter for peak detecting of the magnitude signal and outputting a peak detection signal;

A microcontroller that performs input blanking to remove the peak detection signal representing a rising edge of the magnetic pulse and determines the quick break voltage from the peak detection signal representing a trailing edge of the magnetic pulse.

2. An apparatus for quantitative measurement of quick break voltage according to claim 1, wherein the microcontroller determines a pulse duration of the magnetic field pulse by measurement of the time duration between the peak detection signal representing the rising edge of the magnetic pulse and the peak detection signal representing the trailing edge of the magnetic pulse.

* * * * *